US010617041B2

(12) United States Patent
Domurath et al.

(10) Patent No.: US 10,617,041 B2
(45) Date of Patent: Apr. 7, 2020

(54) MULTI-COMPARTMENT ELECTRICAL APPARATUS WITH SHARED COOLING ASSEMBLY

(71) Applicant: Eaton Intelligent Power Limited, Dublin (IE)

(72) Inventors: Franz S. Domurath, Durham, NC (US); Donald Caulfield, Raleigh, NC (US); George Arthur Navarro, Raleigh, NC (US)

(73) Assignee: Eaton Intelligent Power Limited (IE)

( * ) Notice: Subject to any disclaimer, the term of this patent is extended or adjusted under 35 U.S.C. 154(b) by 0 days.

(21) Appl. No.: 16/241,471

(22) Filed: Jan. 7, 2019

(65) Prior Publication Data
US 2019/0215991 A1 Jul. 11, 2019

Related U.S. Application Data

(60) Provisional application No. 62/614,584, filed on Jan. 8, 2018.

(51) Int. Cl.
*H05K 7/20* (2006.01)
*H01L 23/42* (2006.01)

(52) U.S. Cl.
CPC ......... *H05K 7/20763* (2013.01); *H01L 23/42* (2013.01); *H05K 7/20136* (2013.01); *H05K 7/20145* (2013.01); *H05K 7/20163* (2013.01); *H05K 7/20918* (2013.01)

(58) Field of Classification Search
CPC .................. H05K 7/1432; H05K 7/20918
See application file for complete search history.

(56) References Cited

U.S. PATENT DOCUMENTS

| 4,691,274 | A | * | 9/1987 | Matouk | G06F 1/18 165/80.3 |
|---|---|---|---|---|---|
| 5,481,429 | A | * | 1/1996 | Eriksson | H02B 1/56 361/678 |
| 7,447,022 | B2 | * | 11/2008 | Murakami | H05K 7/206 165/104.34 |
| 8,830,658 | B2 | * | 9/2014 | Eichler | H05K 7/1432 361/677 |

FOREIGN PATENT DOCUMENTS

| DE | 3713054 | 11/1987 |
|---|---|---|
| DE | 102010017168 | 12/2011 |
| DE | 102015115421 | 3/2017 |
| EP | 2469995 | 6/2012 |

OTHER PUBLICATIONS

International Search Report and Written Opinion—corresponding application No. PCT/EP2019/025004; dated Apr. 10, 2019.

\* cited by examiner

*Primary Examiner* — Mukundbhai G Patel
(74) *Attorney, Agent, or Firm* — Stanek Lemon Crouse & Meeks, P.A.

(57) ABSTRACT

An apparatus, such as a power routing apparatus, includes an enclosure having first and second compartments having respective first and second opposing walls. A cooling structure is disposed between the first and second compartments and has a coolant passage defined therein configured to support a coolant flow in a direction parallel to the first and second opposing walls. First and second semiconductor switches (e.g., static switches) are disposed on the first and second walls on opposite sides of the coolant passage and are configured to be cooled by the coolant flow.

15 Claims, 11 Drawing Sheets

MULTI-COMPARTMENT ELECTRICAL APPARATUS WITH SHARED COOLING ASSEMBLY

CROSS-REFERENCE TO RELATED APPLICATION

This U.S. non-provisional patent application claims priority to U.S. Provisional Patent Application No. 62/614,584, filed with the U.S. Patent and Trademark Office on Jan. 8, 2018. The disclosure of which is hereby incorporated in its entirety by reference.

BACKGROUND

The inventive subject relates to electrical equipment and, more particularly, to electrical power equipment including heat-generating semiconductor devices.

Electrical equipment, such as converters, static switches and other apparatus used in power distribution applications, often includes power semiconductor devices, such as transistors (e.g., IGBTs, power MOSFETs) or thyristors (e.g., SCRs). During operation, such devices can generate significant amounts of heat. To prevent degradation of such devices and other nearby electronics, this heat typically is transferred away from the device using heatsinks, convection, fans, liquid coolant systems, heat pipes and other thermal transfer structures. Provision of such thermal transfer structures within confined spaces of cabinets or other enclosures can be problematic as they can occupy an inordinate amount of space and may be subject to form factor constraints arising from the need to provide a heat transfer path to the exterior of the enclosure. Accordingly, there is an ongoing need for improved thermal transfer structures in such applications.

SUMMARY

According to some embodiments of the inventive subject matter, an apparatus, such as a power routing apparatus, includes an enclosure having first and second compartments having respective first and second opposing walls. A cooling structure is disposed between the first and second compartments and has a coolant passage defined therein configured to support a coolant flow in a direction parallel to the first and second opposing walls. First and second semiconductor switches are disposed on the first and second walls on opposite sides of the coolant passage and are configured to be cooled by the coolant flow.

In some embodiments, the cooling structure includes at least one heatsink having at least one heat transfer surface disposed in the coolant passage, wherein the first and second semiconductor switches thermally coupled to the at least one heatsink. The cooling structure may further include at least one fan disposed between the first and second walls and configured to generate the coolant flow. The at least one heatsink may be positioned in the coolant passage such that the at least one heat transfer surface receives the coolant flow from the at least one fan. The cooling structure may also include a duct configured to exhaust coolant received from the heatsink. The cooling structure may further include at least one vent on at least one of the first and second walls and configured to provide coolant from at least one of the first and second inner compartments to the coolant passage.

In some embodiments, the enclosure further includes third and fourth compartments on respective first and second sides of the first and second compartments. The apparatus may include at least one input bus assembly passing from at least one of the first and second compartments into at least one of the third and fourth compartments and electrically connected to at least one of the first and second contactors. The apparatus may further include first and second output bus assemblies electrically coupled to respective ones of the first and second semiconductor switches and passing from respective ones of the first and second compartments to respective ones of the third and fourth compartments.

According to some embodiments of the inventive subject matter, an apparatus includes a cuboid enclosure having first and second outer compartments and first and second inner compartments disposed between the first and second outer compartments such that the first and second inner compartments have respective first and second opposing vertical walls. The apparatus further includes a cooling structure between the first and second vertical walls. The cooling structure includes a coolant intake structure configured to receive air from lower portions of the first and second inner compartments, a fan assembly above the coolant intake structure and comprising at least one fan disposed between the first and second vertical walls and configured to draw air through the coolant intake structure, a heatsink assembly above the fan assembly and having a plurality of heat transfer surfaces that receive air from the fan assembly, and a duct above the heatsink assembly that vertically exhausts air from the heatsink assembly out of the enclosure.

In some embodiments, first and second heat-producing devices are disposed in respective one of the first and second inner compartments and thermally coupled to the heatsink assembly. The first and second heat-producing devices may include respective first and second semiconductor static switches. The apparatus may further include first and second contactors electrically coupled to respective ones of the first and second semiconductor static switches and disposed in respective ones of the first and second inner compartments below respective ones of the first and second semiconductor static switches. In some embodiments, the apparatus may include at least one input bus assembly passing from at least one of the first and second outer compartments into at least one of the first and second inner compartments and electrically connected to at least one of the first and second contactors and first and second output bus assemblies electrically coupled to respective ones of the first and second semiconductor static switches and passing from respective ones of the first and second inner compartments to respective ones of the first and second outer compartments. First and second control circuit assemblies may be mounted on respective ones of the first and second vertical walls above the first and second semiconductor static switches.

DETAILED DESCRIPTION

Figure 1:
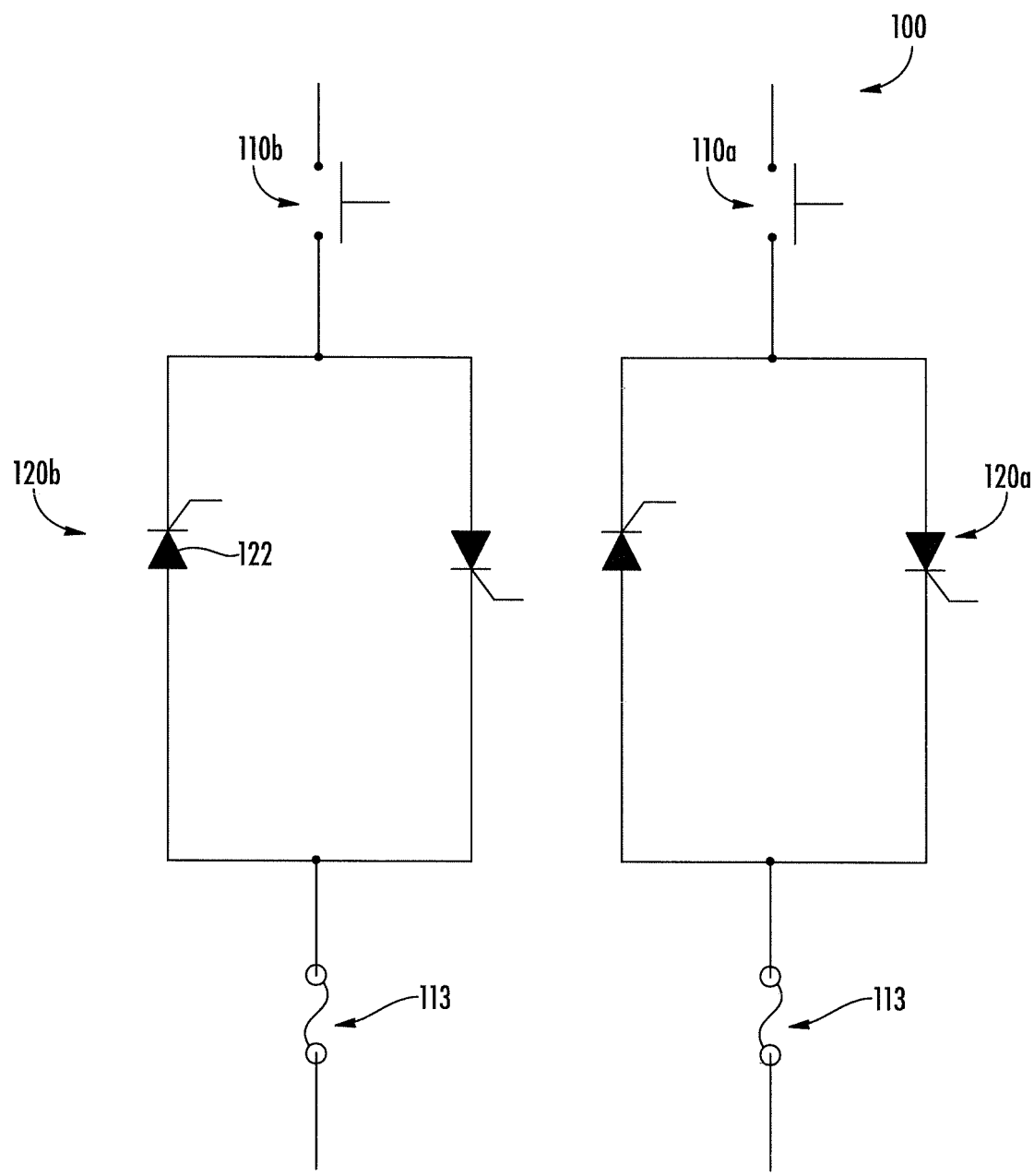
FIG. 1 is a schematic diagram illustrating a power router apparatus according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIG. 1 illustrates a power router apparatus 100 according to some embodiments. The apparatus 100 includes first and second static switch assemblies 120a, 120b, each of which includes antiparallel-connected silicon-controlled rectifiers. It will be appreciated that this arrangement represents an example implementation of a static switch, and that other semiconductor switches, such as power MOSFETs, may be used to provide a similar switch functionality. Respective first and second contactors 110a, 110b are coupled to the static switches 120a, 120b, and may be used, for example, to selectively provide an input to the static switches 120a, 120b, as explained below with reference to FIG. 12. It will be appreciated that other circuit interruption devices, such as circuit breakers, may be used in place of the contactors 110a, 110b.

Figure 2:
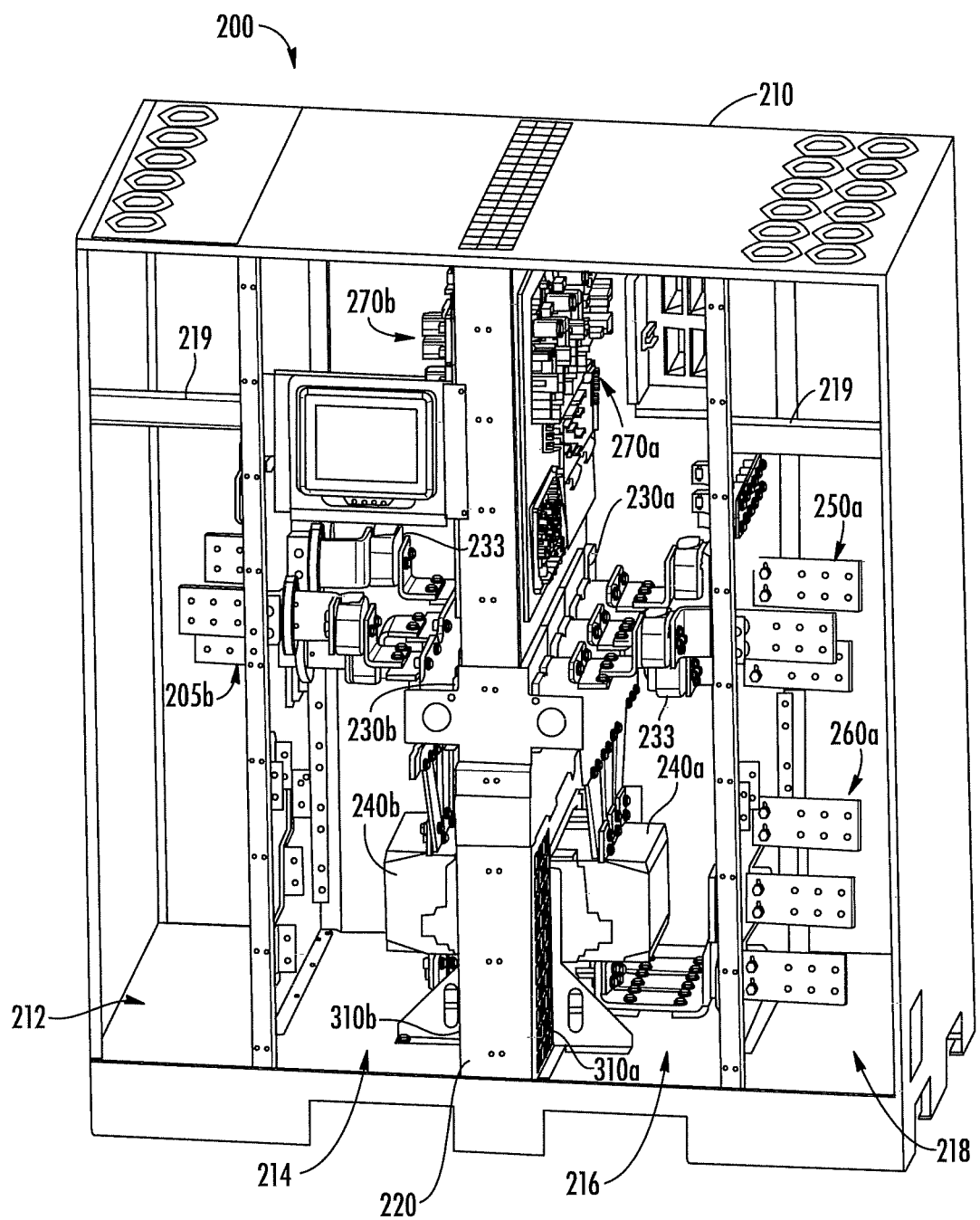
FIG. 2 is a front perspective view of a power router apparatus according to some embodiments.

FIGS. 2-9 illustrate a power router apparatus 200 having the electrical arrangement illustrated in FIG. 1. Referring to FIG. 2, the apparatus 200 includes a cuboid cabinet-like sheet metal enclosure 210, which has four compartments 212, 214, 216, 218 defined therein. Inner compartments 214, 216 house static switches 230a, 230b, contactors 240a, 240b and associated control boards 270a, 270b in a mirror image arrangement on respective sides of a columnar cooling structure 220 disposed between the inner compartments 214, 216. First and second output buses 250a, 250b are connected to respective ones of the static switches 230a, 230b and pass from the inner compartments 214, 216 into outer compartments 212, 218, where they may be connected to cables or other conductors. Current transformers 233 for monitoring currents in the output buses 250a, 250b may be housed within the inner compartments 214, 216. Using this compartment arrangement, components housed in the inner compartments 214, 216 may be shielded from are flashes or other potentially damaging events occurring in the outer compartments 212, 218, and potentially damaging events occurring on one side of the apparatus 200 may be isolated from components on the other side of the apparatus 200. As further illustrated, exterior control cabling for components in the inner compartments 214, 216 may pass through the outer compartments 212, 218 via protected channels 219.

Figure 10:
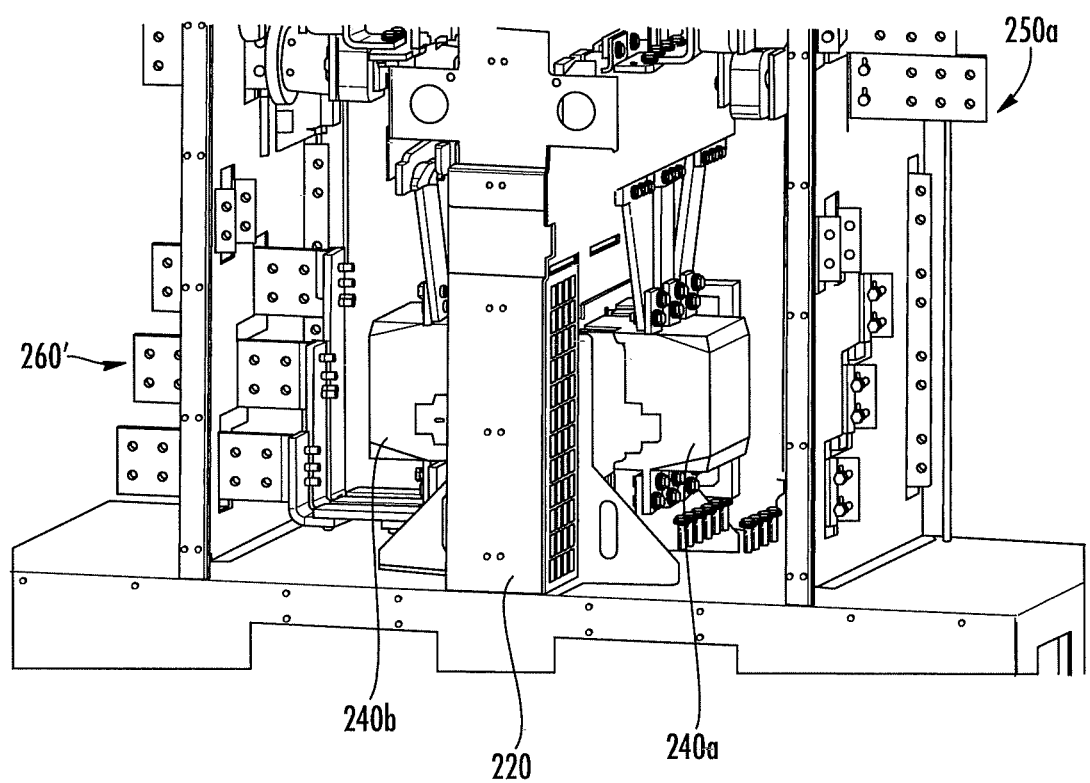
FIG. 10 is a detailed perspective view of a contactor and input bus assembly of the power routing apparatus of FIG. 1 according to some embodiments.
Figure 11:
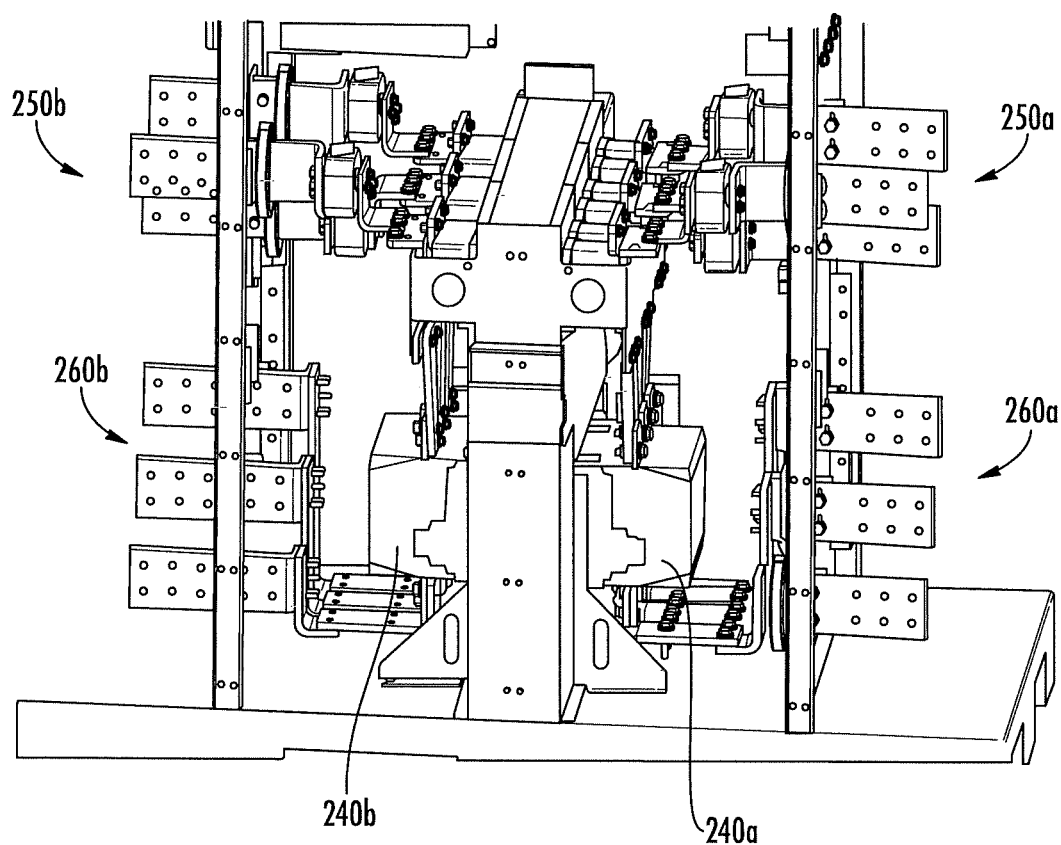
FIG. 11 is another detailed perspective an alternative contactor and input bus arrangement for the power routing apparatus of FIG. 1.

In the illustrated embodiments, the right side outer compartment 218 also houses a common input bus 260 that feeds the contactors 240a, 240b, and provides an enclosure for connection of cables or other conductors to the common input bus 260. It will be appreciated, however, that other input bus arrangements may be provided, such as those described below with reference to FIGS. 10 and 11.

Figure 3:
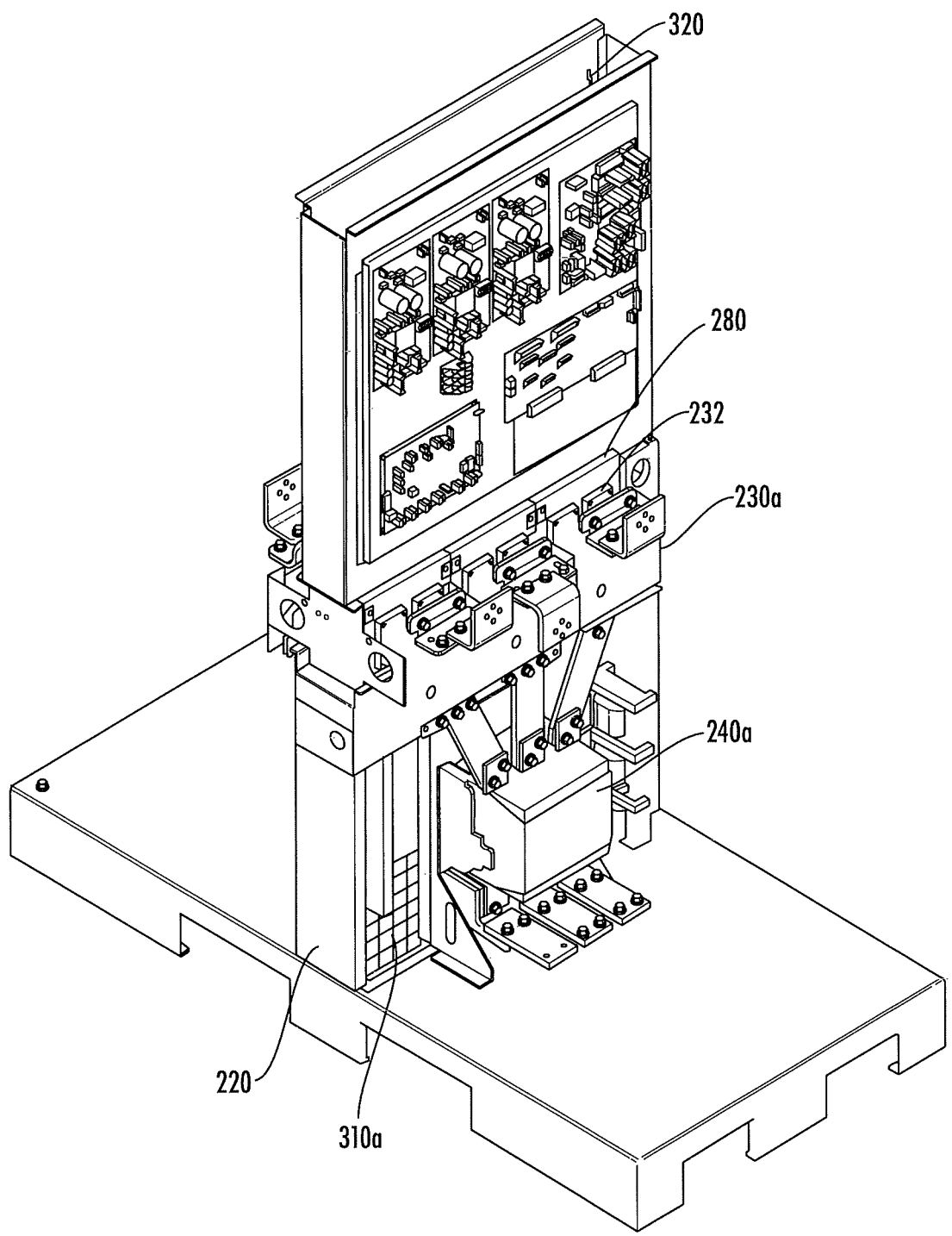
FIG. 3 is a cutaway perspective view of a cooling structure of the power router apparatus of FIG. 2.
Figure 4:
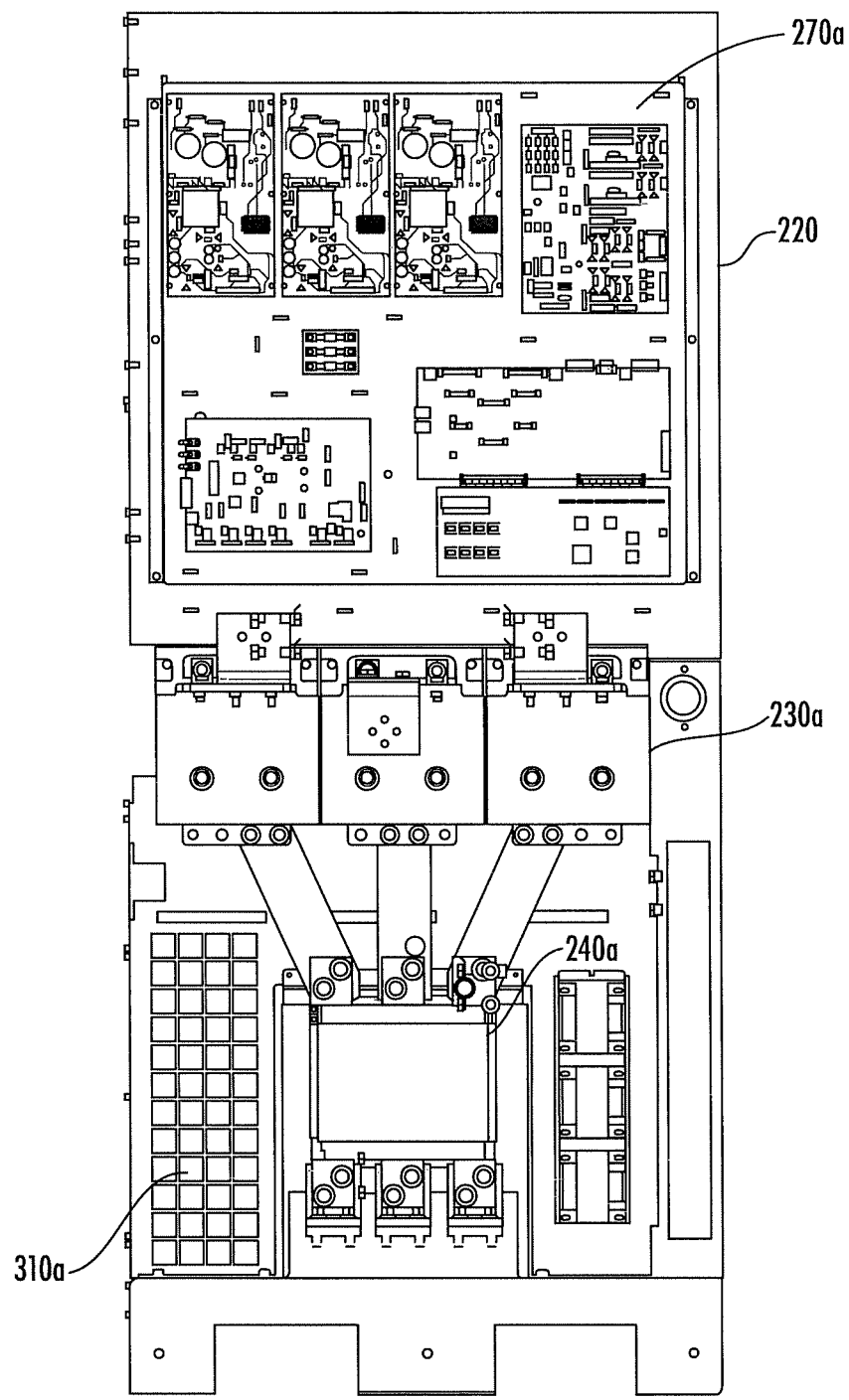
FIG. 4 is a side view of the cooling structure of FIG. 3
Figure 6:
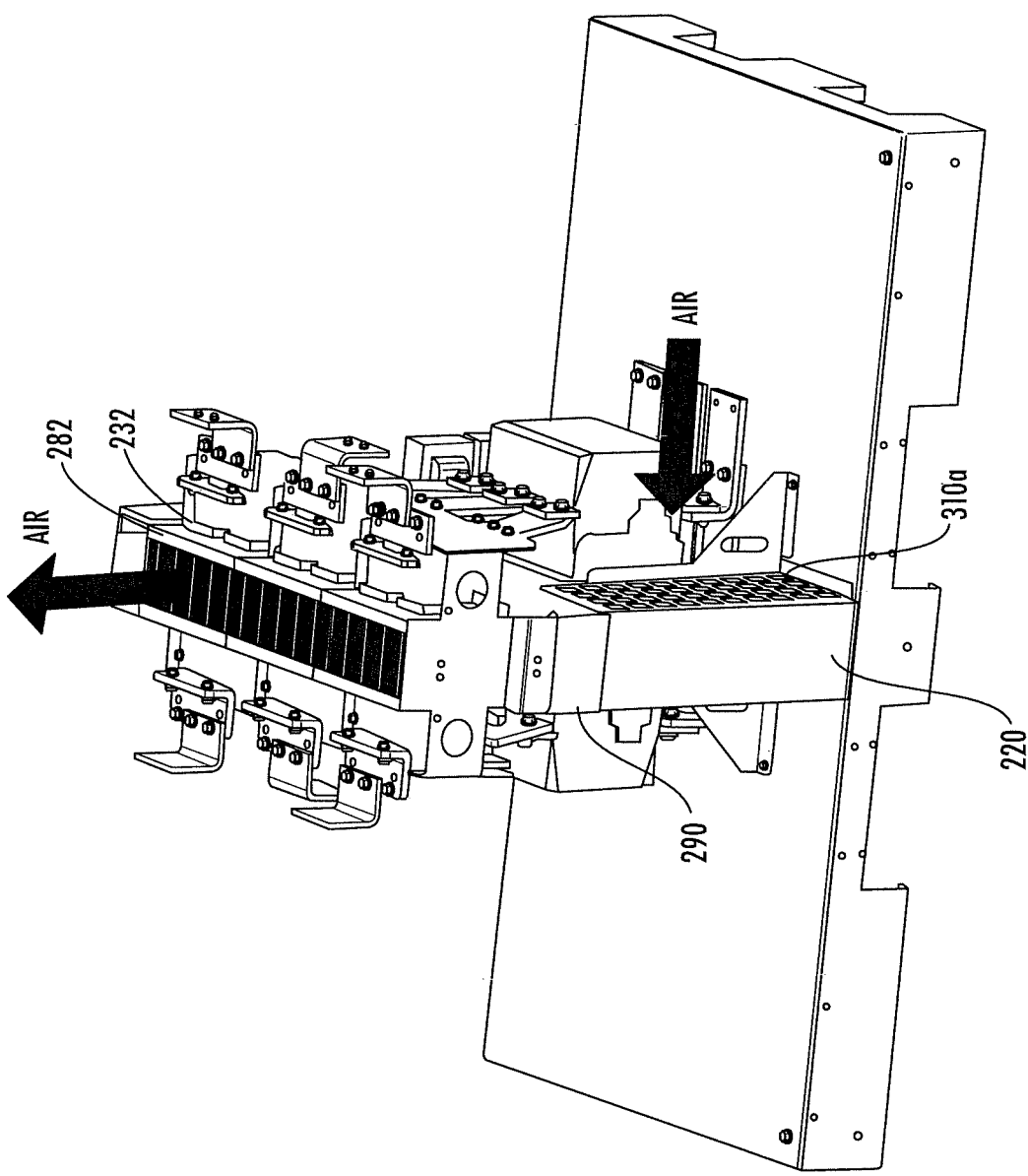
FIG. 6 is a detailed perspective view of lower portions of the cooling structure of FIG. 3.
Figure 7:
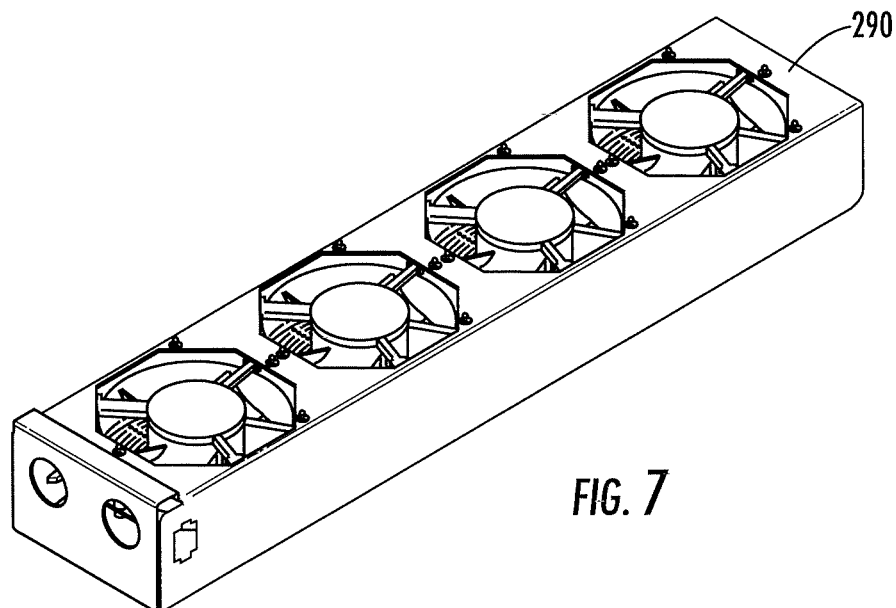
FIG. 7 is a perspective view of a fan assembly of the cooling structure of FIG. 3.
Figure 8:
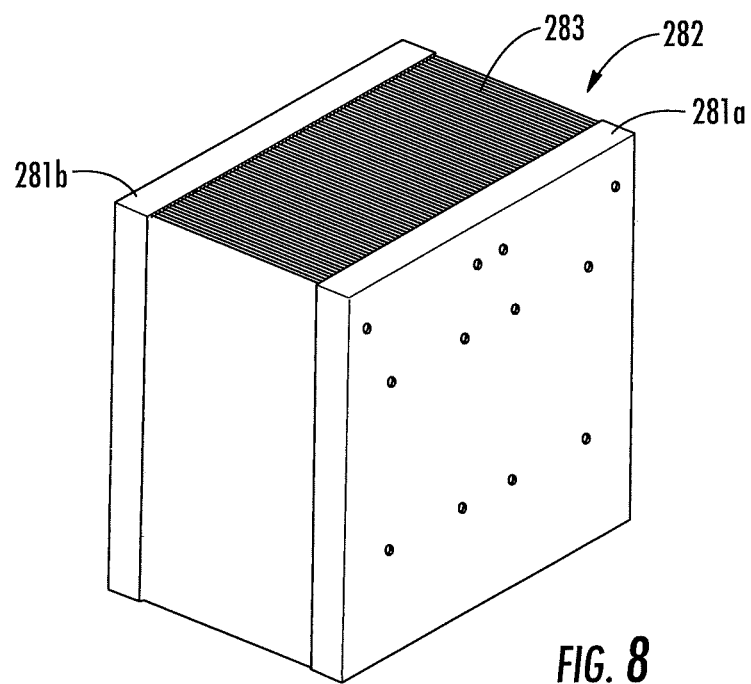
FIG. 8 is a perspective view of a heatsink of the cooling structure of FIG. 3.
Figure 9:
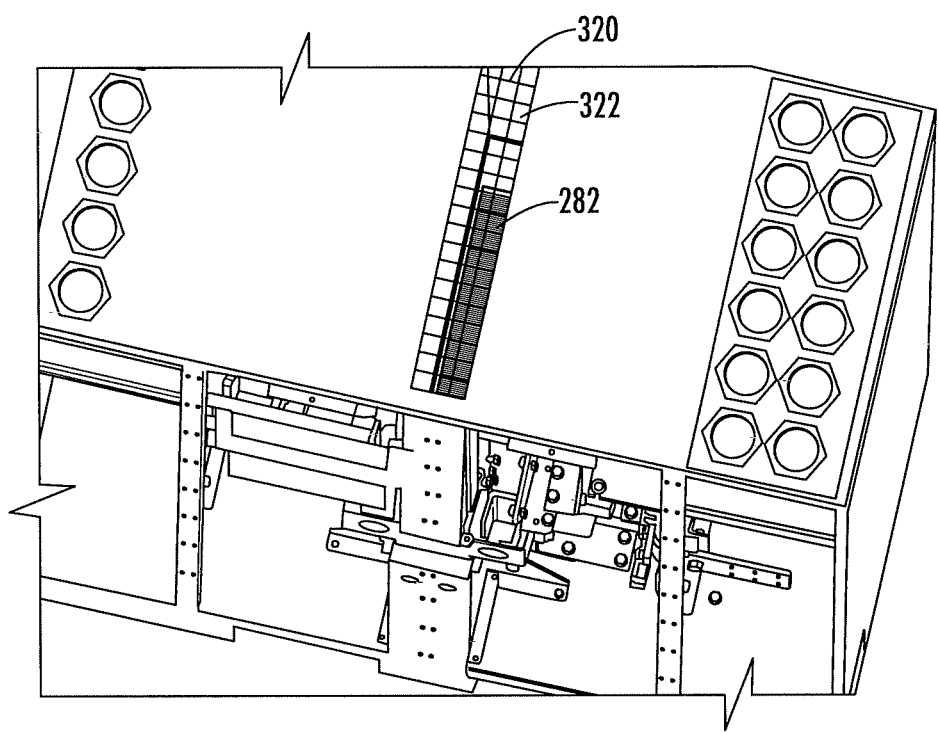
FIG. 9 is a perspective view of an exhaust duct of the cooling structure of FIG. 3.

Referring to FIG. 3, the cooling structure 220 includes a heatsink assembly 280, upon which semiconductor packages 232 (e.g., individual packaged SCRs) of the static switches 230a, 230b are mounted. Referring to FIGS. 6 and 8, the heatsink assembly 280 includes three block-shaped heatsinks 282, each of which comprise parallel rectangular plates 281a, 281b upon which the semiconductor device packages 232 are mounted. The rectangular plates 281a, 281b are interconnected by thinner plates 283 that define a plurality of air channels between the plates 281a, 281b.

Referring FIGS. 2-9, air drawn by fan box 290 of the cooling structure 220 enters through an intake structure including lower vents 310a, 310b. The air passes upward through the fan box 290 and through the air passages in the heatsinks 282. After passing through the heatsinks 282, heated air is exhausted through a vent 322 in the top of the enclosure 210 via a duct 320 disposed between the control boards 270a, 270b.

This shared cooling arrangement can provide an efficient use of space for cooling. In some embodiments, for example, the static switches 230a, 230b may not be used simultaneously, making such a shared cooling arrangement particularly advantageous because it can be sized to provide only the cooling capability needed for operation of one of static switches 230a, 230b at a given time. This can further economize on the amount of space needed for the cooling system.

Figure 5:
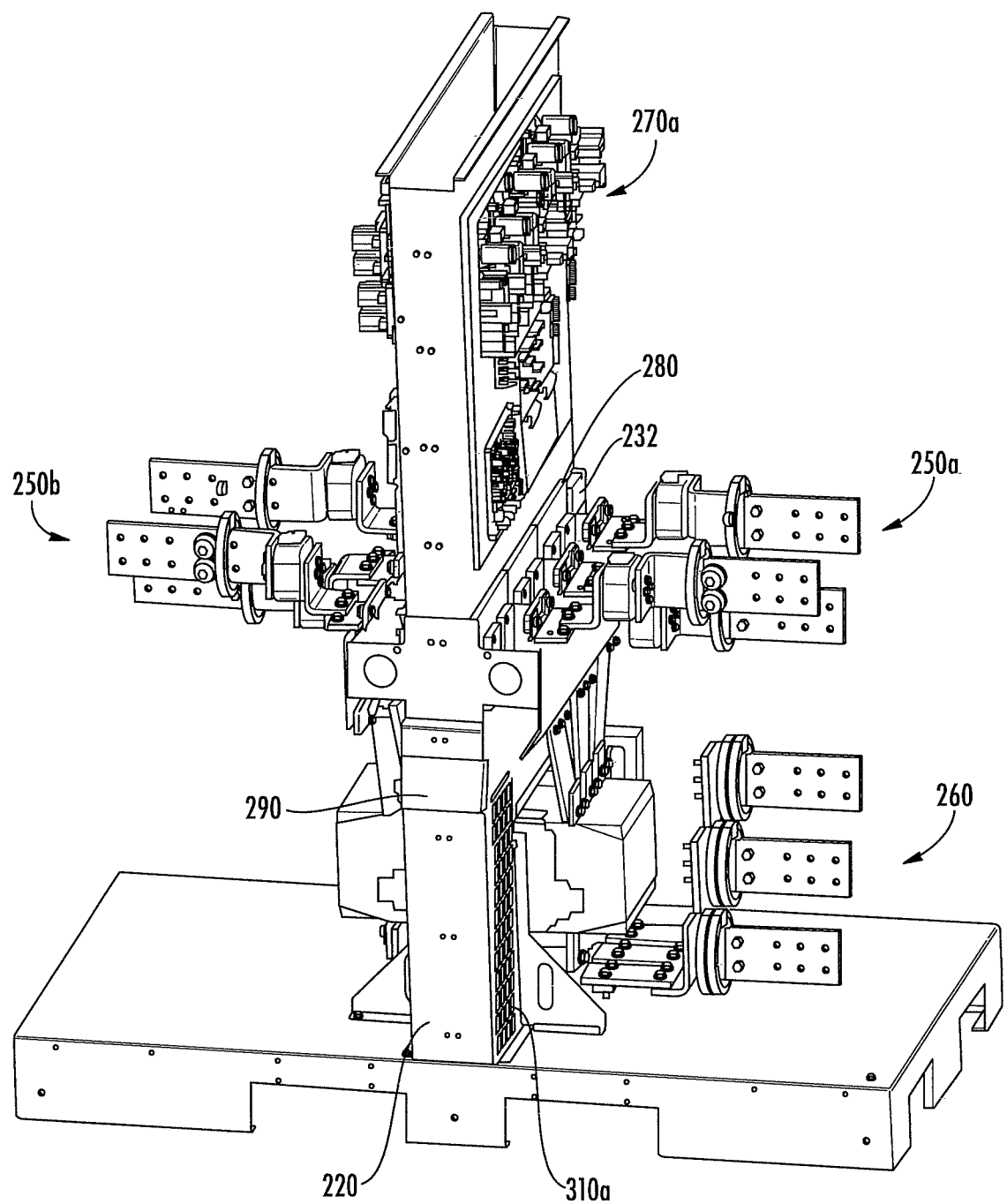
FIG. 5 is a perspective view of the cooling structure and bus assemblies of the power routing apparatus of FIG. 1.

Referring to FIG. 5, a right-side common input bus 260 may be connected to both the right and left side contactors 240a, 240b. However, in some embodiments shown in FIG. 10, a left-side input bus 260' may be connected to the contactors 240a, 240b to provide a left-side connection. In further embodiments shown in FIG. 11, right and left side input buses 260a, 260b may be separately connected to respective ones of the right and left side contactors 240a, 240b.

Figure 12:
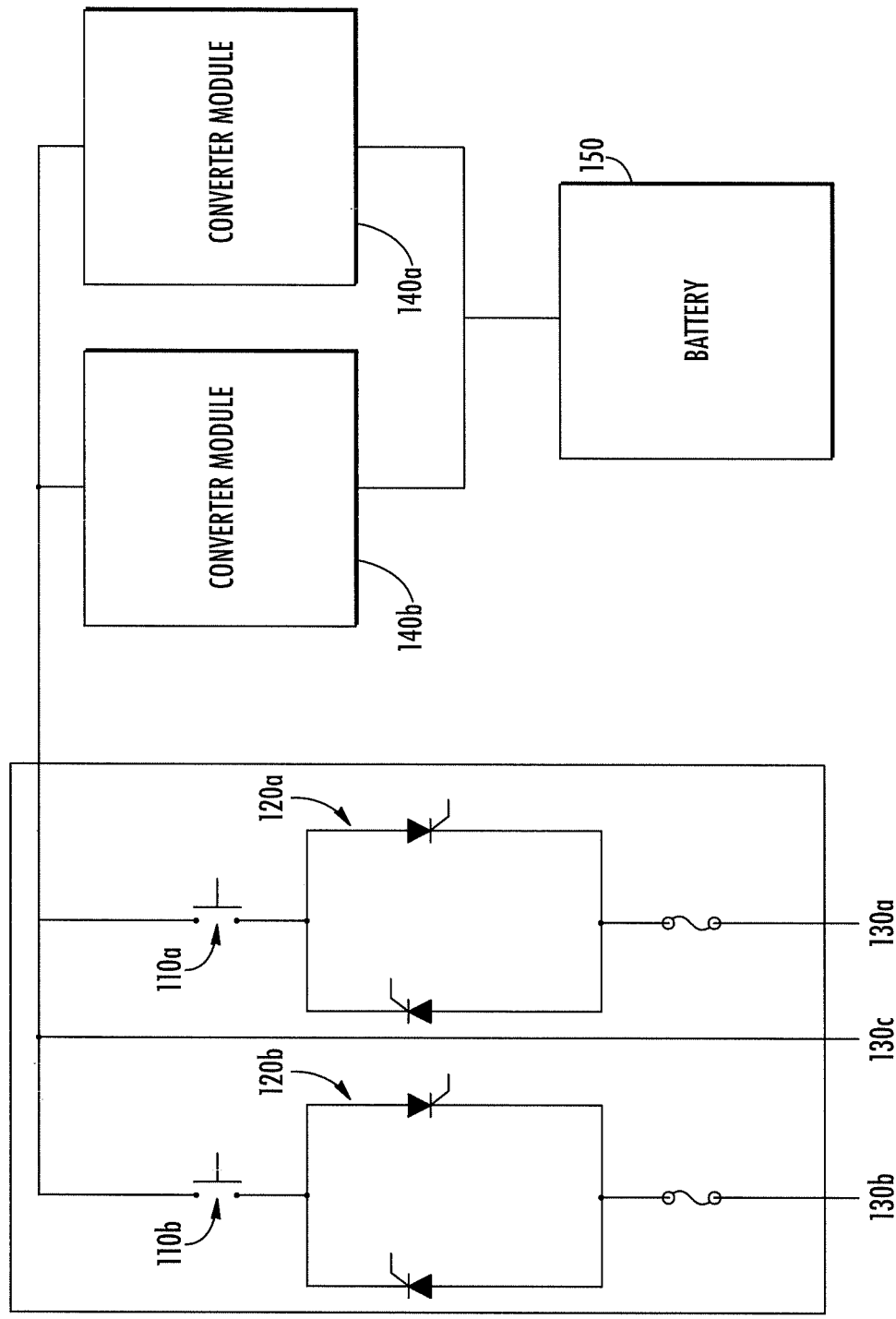
FIG. 12 is a schematic diagram illustrating an exemplary application of a power router apparatus according to further embodiments.

FIG. 12 illustrates an exemplary application of a power router apparatus 100 as described herein. Converter modules 140a, 140b (e.g., inverter modules) are fed by a battery 150 and have outputs connected in common to the contactors 110a, 110b. Respective ones of the static switches 120a, 120b control respective outputs 130a, 130b. A third, unswitched output 130c may also be provided.

In this specification, there have been disclosed embodiments of the inventive subject matter and, although specific terms are employed, they are used in a generic and descriptive sense only and not for purposes of limitation. The following claims are provided to ensure that the present application meets all statutory requirements as a priority application in all jurisdictions and shall not be construed as limiting the scope of the inventive subject matter.

The invention claimed is:

1. An apparatus comprising:
   an enclosure having first and second compartments having respective first and second opposing walls;
   a cooling structure between the first and second compartments and having a coolant passage defined therein configured to support a coolant flow in a direction parallel to the first and second opposing walls;
   a heatsink disposed in the coolant passage; and
   first and second semiconductor switches disposed in respective ones of the first and second compartments and thermally coupled to first and second sides of the heatsink so that both of the first and second semiconductor switches are cooled by the coolant flow through the heatsink.

2. The apparatus of claim 1, wherein the cooling structure further comprises at least one fan disposed between the first and second walls and configured to generate the coolant flow.

3. The apparatus of claim 2, wherein the heatsink is positioned in the coolant passage such that at least one heat transfer surface receives the coolant flow from the at least one fan.

4. The apparatus of claim 3, wherein the cooling structure further comprises a duct configured to exhaust coolant received from the heatsink.

5. The apparatus of claim 2, wherein at least one fan comprises a plurality of fans.

6. The apparatus of claim 1, wherein the cooling structure further comprises at least one vent on at least one of the first and second walls and configured to provide coolant from inside at least one of the first and second compartments to the coolant passage.

7. The apparatus of claim 1, further comprising first and second contractors electrically coupled to respective ones of the first and second semiconductor switches and disposed in respective ones of the first and second compartments.

8. The apparatus of claim 7, wherein the enclosure further comprises third and fourth compartments on respective first and second sides of the first and second compartments, and wherein the apparatus further comprises at least one input bus assembly passing from at least one of the first and second compartments into at least one of the third and fourth compartments and electrically connected to at least one of the first and second contactors.

9. An apparatus comprising:
   an enclosure having first and second compartments having respective first and second opposing walls;
   a cooling structure between the first and second compartments and having a coolant passage defined therein configured to support a coolant flow in a direction parallel to the first and second opposing walls;
   first and second semiconductor switches on the first and second walls on opposite sides of the coolant passage and configured to be cooled by the coolant flow;
   third and fourth compartments on respective first and second sides of the first and second compartment; and
   first and second output bus assemblies coupled to respective ones of the first and second semiconductor switches and passing from respective ones of the first and second compartments to respective ones of the third and fourth compartments.

10. An apparatus comprising:
    a cuboid enclosure having first and second outer compartments and first and second inner compartments disposed between the first and second outer compartments such that the first and second inner compartments have respective first and second opposing vertical walls; and
    a cooling structure between the first and second vertical walls and comprising:
       a coolant intake structure configured to receive air from lower portions of the first and second inner compartments;
       a fan assembly above the coolant intake structure and comprising at least one fan disposed between the first and second vertical walls and configured to draw air through the coolant intake structure;
       a heatsink assembly above the fan assembly and having a plurality of heat transfer surfaces that receive air from the fan assembly;
       first and second semiconductor static switches disposed in respective ones of the first and second inner compartments and thermally coupled to the heatsink assembly;
       first and second output bus assemblies electrically coupled to respective ones of the first and second semiconductor static switches and passing from respective ones of the first and second inner compartments to respective ones of the first and second outer compartments; and
       a duct above the heatsink assembly that vertically exhausts air from the heatsink assembly out of the enclosure.

11. The apparatus of claim 10, further comprising first and second contactors electrically coupled to respective ones of the first and second semiconductor static switches and disposed in respective ones of the first and second inner compartments below respective ones of the first and second semiconductor static switches.

12. The apparatus of claim 11, further comprising at least one input bus assembly passing from at least one of the first and second outer compartments into at least one of the first and second inner compartments and electrically connected to at least one of the first and second contactors.

13. The apparatus of claim 10, further comprising first and second control circuit assemblies mounted on respective ones of the first and second vertical walls above the first and second semiconductor static switches.

14. The apparatus of claim 10, wherein the first and second static switches partially protrude into respective openings in the first and second vertical walls.

15. The apparatus of claim 10, wherein the coolant intake structure comprises first and second vents in respective ones of the first and second vertical walls.

* * * * *